United States Patent
Park

(10) Patent No.: US 7,446,741 B2
(45) Date of Patent: Nov. 4, 2008

(54) ACTIVE MATRIX ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 713 days.

(21) Appl. No.: 11/020,065

(22) Filed: Dec. 23, 2004

(65) Prior Publication Data

US 2005/0156514 A1    Jul. 21, 2005

(30) Foreign Application Priority Data

Dec. 27, 2003    (KR)    ........................ 10-2003-0098135

(51) Int. Cl.
G09G 3/30    (2006.01)

(52) U.S. Cl. ........................................ 345/76

(58) Field of Classification Search ................... 345/76, 345/84–89, 55, 212, 205, 213, 90, 92, 82, 345/94, 96, 98, 100, 108, 201, 204; 313/504, 313/500, 506, 610, 498, 503, 512, 509, 306; 257/40, 59, 72, 347, 79; 315/169.3, 169.4
See application file for complete search history.

(56) References Cited

U.S. PATENT DOCUMENTS

| | | | |
|---|---|---|---|
| 4,781,437 A * | 11/1988 | Shields et al. ................. | 345/87 |
| 5,808,317 A * | 9/1998 | Kuo ............................. | 257/66 |
| 6,219,019 B1 * | 4/2001 | Hasegawa et al. ............. | 345/96 |
| 6,791,633 B2 * | 9/2004 | Matsumoto ................... | 349/42 |
| 6,891,522 B2 * | 5/2005 | Song et al. .................... | 345/87 |
| 7,009,254 B2 * | 3/2006 | Nagasawa et al. ........... | 257/355 |
| 7,126,268 B2 * | 10/2006 | Kitazawa .................... | 313/500 |
| 7,354,328 B2 * | 4/2008 | Lee .............................. | 445/24 |
| 7,385,348 B2 * | 6/2008 | Park et al. .................... | 313/512 |
| 2002/0084960 A1 * | 7/2002 | Song et al. .................... | 345/87 |
| 2002/0176030 A1 * | 11/2002 | Matsumoto ................... | 349/43 |
| 2003/0132896 A1 * | 7/2003 | Matsueda .................... | 345/55 |
| 2004/0004591 A1 * | 1/2004 | Akimoto et al. .............. | 345/84 |
| 2004/0017162 A1 * | 1/2004 | Sato et al. ................. | 315/169.3 |
| 2004/0075380 A1 * | 4/2004 | Takemoto et al. ........... | 313/500 |
| 2004/0109106 A1 * | 6/2004 | Yang et al. .................... | 349/69 |
| 2005/0140285 A1 * | 6/2005 | Park et al. .................... | 313/506 |
| 2007/0200805 A1 * | 8/2007 | Sato et al. ..................... | 345/76 |

* cited by examiner

*Primary Examiner*—Prabodh Dharia
(74) *Attorney, Agent, or Firm*—Morgan Lewis & Bockius LLP

(57) ABSTRACT

An organic electroluminescent display device includes a gate line on a first substrate; a data line intersecting the gate line on the first substrate; a switching thin film transistor at the intersection of the gate line and data line; a driving thin film transistor having a first driving dual gate, a driving active layer, a driving source, a driving drain, and a second driving dual gate, and the driving thin film transistor connected to the switching thin film transistor; an organic electroluminescent diode on a second substrate; and a connection pattern connecting the driving drain and the organic electroluminescent diode between the first and second substrates.

30 Claims, 20 Drawing Sheets

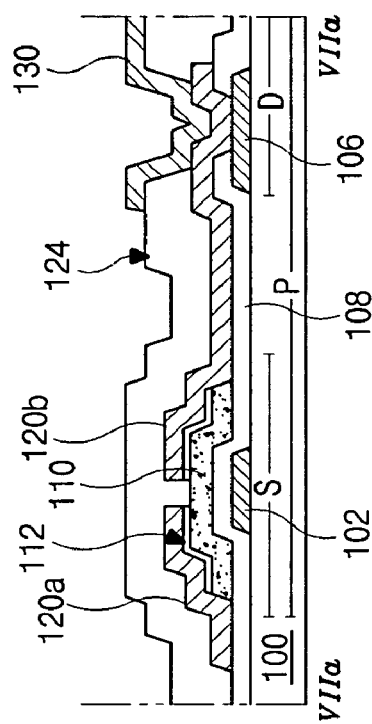
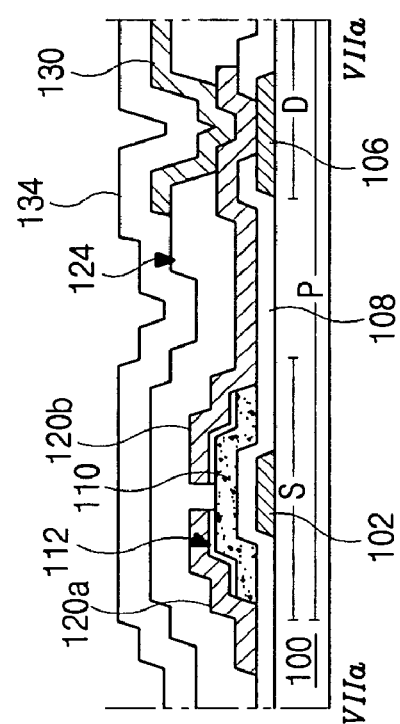

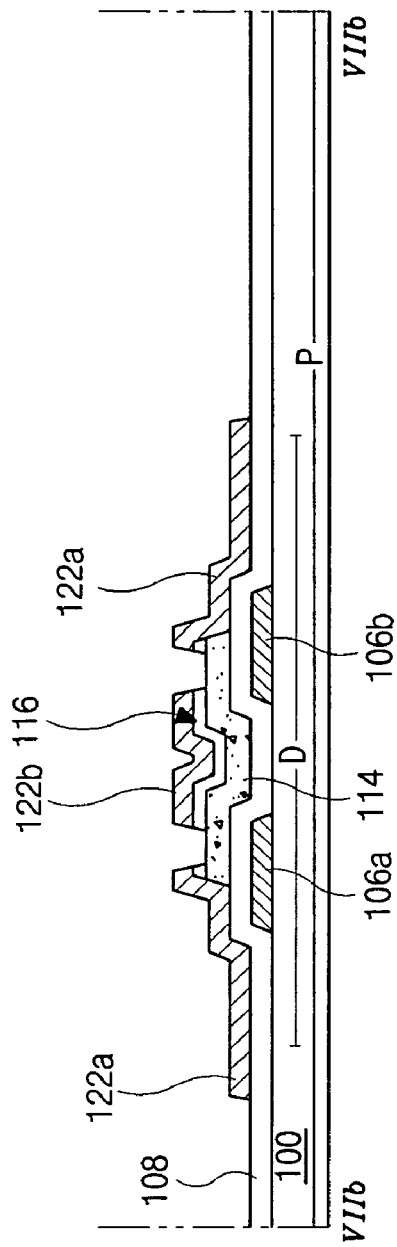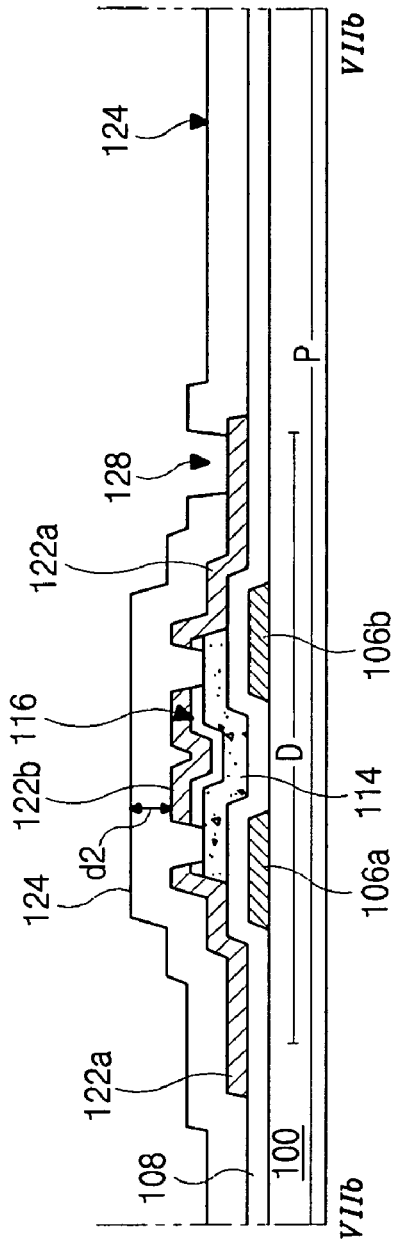

ACTIVE MATRIX ORGANIC ELECTROLUMINESCENT DISPLAY DEVICE AND METHOD OF FABRICATING THE SAME

The present invention claims the benefit of Korean Patent Application No. 2003-0098135 filed in Korea on Dec. 27, 2003, which is hereby incorporated by reference.

BACKGROUND OF THE INVENTION

1. Field of the Invention

The present invention relates to a display device and a method of fabricating a display device, and more particularly, to an active matrix organic electroluminescent display (OELD) device and method of fabricating an OELD device.

2. Discussion of the Related Art

Organic electroluminescent display devices include a cathode electrode to inject electrons, an anode electrode to inject holes, and an organic electroluminescent layer between the two electrodes. An organic electroluminescent diode has a multi-layer structure of organic thin films provided between the anode electrode and the cathode electrode. When a forward current is applied to the organic electroluminescent diode, electron-hole pairs (often referred to as excitons) combine in the organic electroluminescent layer as a result of a P-N junction between the anode electrode and the cathode electrode. The electron-hole pairs have a lower energy when combined as compared to when they are separated. The resultant energy gap between the combined and separated electron-hole pairs is converted into light by an organic electroluminescent element. In other words, the organic electroluminescent layer emits the generated energy due to the recombination of electrons and holes in response to an applied current.

As a result of the above-described principles, the organic electroluminescent display devices do not need an additional light source as compared to related art liquid crystal display devices. Moreover, the electroluminescent display devices are thin, light weight, and are very energy efficient. As a result, the organic electroluminescent display devices have excellent advantages when displaying images, for example, low power consumption, high brightness, and a short response time. Because of these advantageous characteristics, the organic electroluminescent display devices are regarded as a promising candidate to be implemented in the various next-generation consumer electronic appliances, such as mobile communication devices, CNS (car navigation system), PDAs (personal digital assistances), camcorders, and palm PCs. Also, because the fabrication of such the organic electroluminescent display devices is a relatively simple process, production cost for the organic electroluminescent display devices is lower than that of the related art liquid crystal display devices.

The organic electroluminescent display devices may be provided in either a passive matrix type arrangement or an active matrix type arrangement. The passive matrix type has a simple structure and fabrication process, but has a high power consumption than the active matrix type. Furthermore, because the structure of passive matrix organic electroluminescent display devices limits the display size, it is difficult to adapt the passive matrix type to large sized devices. Moreover, the aperture ratio of the passive matrix type decreases as the bus lines increases. In contrast, active matrix type organic electroluminescent display devices provide a higher display quality with higher luminosity than that of the passive matrix type.

FIG. 1 is a schematic cross-sectional view illustrating an active matrix type organic electroluminescent display device according to the related art arrangement. As shown in FIG. 1, an organic electroluminescent display device 10 includes first and second substrates 12 and 28, which are attached to each other by a sealant 26. On the first substrate 12, a plurality of thin film transistors (TFTs) T and array portions 14 are formed. Each of the TFTs T corresponds to each pixel region P. A first electrode (i.e., an anode electrode) 16, an organic electroluminescent layer 18 and a second electrode (i.e., a cathode electrode) 20 are sequentially formed on the array portion 14. At this point, the organic electroluminescent layer 18 emits light corresponding to red (R), green (G) or blue (B) color in each pixel P. In particular, to show color images, organic materials emitting the R, G and B colors are disposed respectively in each pixel P.

As additionally shown in FIG. 1, the second substrate 28, which is attached to the first substrate 12 by the sealant 26, includes a moisture absorbent (i.e., desiccant) 22 on the rear surface thereof. The moisture absorbent 22 absorbs the moisture that may exist in the cell gap between the first and second substrates 12 and 28. When disposing the moisture absorbent 22 in the second substrate 28, a portion of the second substrate 28 is etched to form a dent. Thereafter, the moisture absorbent 22 that may be a powder type is disposed into this dent, and then, a sealing tape 25 is put on the second substrate 28 to fix the powder-type moisture absorbent 22 in the dent.

FIG. 2 is an equivalent circuit diagram illustrating a pixel of the organic electroluminescent display device according to the related art arrangement. As shown in FIG. 2, a gate line 36 is disposed in a transverse (i.e., horizontal) direction and a data line 49 is disposed in a longitudinal (i.e., vertical) direction substantially perpendicular to the gate line 36. A switching thin film transistor (switching TFT) $T_S$ is disposed near a crossing of the gate and data lines 36 and 49 and a driving thin film transistor (driving TFT) $T_D$ is disposed electrically connecting to the switching thin film transistor $T_S$ and a power line 62. In addition, the driving TFT $T_D$ is electrically connected to an organic electroluminescent diode E. A storage capacitor Cst is disposed between a driving source 52 and a driving gate 34 of the driving TFT $T_D$. The storage capacitor Cst is also connected to a switching drain of the switching TFT $T_S$ and the power line 62. A switching source of the switching TFT $T_S$ is connected to the data line 49, and a driving source 52 of the driving TFT $T_D$ is connected to the power line 62. A switching gate 32 of the switching TFT $T_S$ is connected to the gate line 36. The organic electroluminescent diode E comprises a first electrode, an organic electroluminescent layer and a second electrode, as described in FIG. 1. The first electrode of the organic electroluminescent diode E electrically contacts with a driving drain 54 of the driving TFT $T_D$, the organic electroluminescent layer is disposed on the first electrode, and the second electrode is disposed on the organic electroluminescent layer.

Now, an operation of the organic electroluminescent display device will be briefly explained with reference to FIG. 2. When a gate signal is applied to the switching gate 32 of the switching TFT $T_S$ from the gate line 36, a data current signal flowing through the data line 49 is converted into a voltage signal by the switching TFT $T_S$ to be applied to the driving gate 34 of the driving TFT $T_D$. Thereafter, the driving TFT $T_D$ is operated and determines a current level that flows into the organic electroluminescent diode E. As a result, the organic electroluminescent diode E can display a gray scale between black and white.

The voltage signal is also applied to the storage capacitor Cst such that a charge is stored in the storage capacitor Cst.

The charge stored in the storage capacitor Cst maintains the voltage of the voltage signal on the driving gate 34. Thus, although the switching TFT $T_S$ is turned off, the current level flowing to the organic electroluminescent diode E remains constant until the next voltage signal is applied.

Meanwhile, the switching and driving TFTs $T_S$ and $T_D$ may include either a polycrystalline silicon layer or an amorphous silicon layer. When the TFTs $T_S$ and $T_D$ include an amorphous silicon layer, fabrication of the TFTs $T_S$ and $T_D$ is much simpler as compared to TFTs $T_S$ and $T_D$ that include a polycrystalline silicon layer.

FIG. 3 is a schematic plan view of an active matrix organic electroluminescent display device having an amorphous silicon layer according to the related art. As shown in FIG. 3, the active matrix organic light emitting diode device includes, for example, inverted staggered type thin film transistors that functions as a bottom emission type.

A gate line 36 intersects a data line 49 and a power line 62, in which the data line and the data and power lines 49 and 62 respectively are spaced apart from each other. A pixel region defined by the gate line 36 and intersections of the data and power supply lines 49 and 62. A switching thin film transistor (TFT) $T_S$ is disposed adjacent to a position where the gate line 36 and the data line 49 cross each other. A driving thin film transistor (TFT) $T_D$ is disposed next to the power line 62 and in the pixel region. The driving TFT $T_D$ has a larger size than the switching TFT $T_S$, and therefore, the driving TFT $T_D$ occupies a relatively large space of the pixel region.

The switching TFT $T_S$ includes a switching gate 32 extending from the gate line 36, a switching source 48 extending from the data line 49, a switching drain 50 spaced apart from the switching source 48, and a switching active layer 56a above the switching gate electrode 32. The switching active layer 56a is formed of amorphous silicon and has an island shape.

The driving TFT $T_D$ is connected to the switching TFT $T_S$ and the power line 62. The driving TFT $T_D$ includes a driving gate 34, a driving source 52, a driving drain and a driving active layer 58a. The driving gate 34 is connected with the switching drain 50 and elongates along side of the power line 62. The driving active layer 58a is formed of amorphous silicon and has a long island shape. Additionally, the driving active layer 58a also elongates along side of the power line 62 while also corresponding and overlapping the driving gate 34. The driving source and drain 52 and 54 overlap side portions of the driving gate 34. The driving active layer 58a having an island shape is disposed above the driving gate 34 between the driving source and drain 52 and 54.

As also shown in FIG. 3, the power line 62 has a protrusion extending to the driving source 50 and electrically communicates with the driving source 50 through the protrusion. A first electrode 66 of the organic electroluminescent diode is disposed in the pixel region and connected with the driving drain 54.

The driving thin film transistor $T_D$ needs to have an ability to operate and drive the organic electroluminescent diode. Thus, a channel of the driving thin film transistor $T_D$ should have a large channel width W and a short channel length L such that the ratio of width W and length L should be large enough. Thus, the driving thin film transistor $T_D$ can supply sufficient current to the organic electroluminescent diode to operate and to drive the organic electroluminescent diode.

FIGS. 4A and 4B are cross sectional views taken along lines IVa-IVa and IVb-IVb of FIG. 3, illustrating the switching thin film transistor and the driving thin film transistor, respectively.

In FIGS. 4A and 4B, the switching gate 32 and the driving gate 34 are formed on a substrate 30. Although not shown in FIGS. 4A and 4B, but shown in FIG. 3, the gate line 36 is also formed on the substrate 30. As described before, the driving gate 34 is larger than the switching gate 32 and occupies a large portion of the pixel region. A gate insulating layer 38 is formed on the substrate to cover the driving and switching gates 32 and 34 and the gate line 36. The gate insulating layer 38 has a contact hole that exposes one end of the driving gate 34. A switching semiconductor layer 56 and a driving semiconductor layer 58 are formed on the gate insulating layer 38, respectively, above the switching gate 32 and above the driving gate 34. The switching semiconductor layer 56 comprises a switching active layer 56a of undoped amorphous silicon and a switching ohmic contact layer 56b of doped amorphous silicon. The driving semiconductor layer 58 also comprises a driving active layer 58a of undoped amorphous silicon and a driving ohmic contact layer 58b of doped amorphous silicon. As shown in FIG. 3, the driving semiconductor layer 58 is larger than the switching semiconductor layer 56 enough to overlap the driving gate 34. The switching source and drain 48 and 50 are formed spaced apart from each other and contact the switching ohmic contact layer 56b, and the driving source and drain 52 and 54 are formed spaced apart from each other and contact the diving ohmic contact layer 58b. The switching drain 50 also electrically contacts the driving gate 34 within the contact hole defined through the gate insulating layer 38. The data line 49 is also formed on the gate insulating layer 38 integrated with the switching source 48 and disposed perpendicularly intersecting the gate line 36, as shown in FIGS. 3 and 4A. Accordingly, the switching thin film transistor $T_S$ and the driving thin film transistor $T_D$ are formed.

A first passivation layer 60 is formed over the entire of the substrate 30 to cover the switching thin film transistor $T_S$ and the driving thin film transistor $T_D$. The first passivation layer 60 has a contact hole that exposes a portion of the driving source 52. Then, the power line 62 is formed on the first passivation layer 60 and contacts the driving source 52 within the contact hole defined through the first passivation layer 60, as shown in FIG. 4B. The power line 62 is spaced apart from the data line 49 and perpendicularly intersects the gate line 36, as shown in FIG. 3, thereby defining the pixel region with the gate and data lines 36 and 49. A second passivation layer 64 is formed over the entire surface of the first passivation layer 60 to cover the power line 62. The first and second passivation layers 60 and 64 have a contact hole that exposes a portion of the driving drain 54. The first electrode 66 of the organic electroluminescent diode is formed on the second passivation layer 64 and electrically contacts the driving drain 54 within the contact hole defined through the first and second passivation layers 60 and 64. The first electrode 66 is disposed in the pixel region as shown in FIG. 3.

In the related art shown in FIGS. 3 and 4A-4B, the driving active layer 58a has a wide channel width and a short channel length, accordingly the driving thin film transistor $T_D$ occupies a large amount of the pixel region. Thus, an aperture ratio of the bottom emission type organic electroluminescent display device is decreased. Furthermore, since a large amount of current flows through the driving thin film transistor $T_D$, current stress may be caused in the driving thin film transistor $T_D$, thereby damaging the driving thin film transistor $T_D$. Especially, when the DC bias is continuously applied to the driving thin film transistor $T_D$, the electrical properties of the driving thin film transistors $T_D$ deteriorates and eventually malfunctions. Furthermore, since only one driving thin film transistor $T_D$ is adopted to operate the organic electroluminescent diode in a pixel, the deterioration of the driving thin film transistor $T_D$ may be accelerated. Accordingly, the active matrix organic electroluminescent display devices having the above-mentioned driving thin film transistor may show an residual image phenomenon, resulting in poor display quality. Moreover, when the driving thin film transistor is deteriorated and malfunctioned by the electrical stress, a point defect occurs in the pixel.

As above described, the organic electroluminescent display devices of FIGS. 1-3 and 4A-4B is a bottom emission type according to an emission direction of light used for displaying images. The bottom emission type organic electroluminescent display device has the advantage of high encapsulation stability. However, the bottom emission type organic electroluminescent display devices are ineffective as high-resolution devices since the disposition of the thin film transistors and the storage capacitor formed on the substrate results in a poor aperture ratio. In contrast to the bottom emission type, a top emission type organic electroluminescent display device has a higher aperture ratio because they have simpler circuit layouts that make it possible to direct the emitted light to the substrate where there are no thin film transistors and the storage capacitors.

In the top emission type organic electroluminescent display device according to the related art, the thin film transistors and the organic electroluminescent diodes are formed over the first substrate, and an additional second substrate is attached to the first substrate to encapsulate the organic electroluminescent device. However, when the thin film transistors and the organic electroluminescent diode are formed on the same substrate in this way, production yield of the organic electroluminescent display devices is determined by a multiplication of the thin film transistor's yield together with the organic electroluminescent diode's yield. Since the organic electroluminescent diode's yield is relatively low, the production yield of the overall organic electroluminescent display devices becomes limited. For example, even when thin film transistors are well fabricated, the organic electroluminescent display devices can be a poor product because of the defects of an organic electroluminescent layer that has about 1000 angstroms (Å) thickness. This results in loss of materials and increased production costs.

SUMMARY OF THE INVENTION

Accordingly, the present invention is directed to an organic electroluminescent display (OELD) devices and a method of fabricating the OELD devices that substantially obviates one or more of the problems due to limitations and disadvantages of the related art.

An object of the present invention is to provide an active matrix OELD device having a driving thin film transistor arrangement in a pixel with decreased electrical current stress and increased channel width.

Another object of the present invention is to provide a dual panel type OELD device having improved image resolution and high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a gate line on a first substrate; a data line intersecting the gate line on the first substrate; a switching thin film transistor at the intersection of the gate line and data line; a driving thin film transistor having a first driving dual gate, a driving active layer, a driving source, a driving drain, and a second driving dual gate, and the driving thin film transistor connected to the switching thin film transistor; an organic electroluminescent diode on a second substrate; and a connection pattern connecting the driving drain and the organic electroluminescent diode between the first and second substrates.

In another aspect, a method of fabricating an organic electroluminescent display device includes pixels each having a pixel region, a switching region and a driving region, and forming a first metal layer on a first substrate; patterning the first metal layer to form a gate line, a switching gate in the switching region, and a first driving dual gate in the pixel region; forming a first insulating layer on the first substrate to cover the gate line, the switching gate, the first driving dual gate; forming a switching active layer on the first insulating layer over the switching gate and a driving active layer on the first insulating layer over the first diving dual gate; patterning the first insulating layer to define a first contact hole exposing a portion of the first driving dual gate; forming a second metal layer over the switching and driving active layers; patterning the second metal layer to form a switching source, a switching drain, a data line, a driving source and a driving drain, thereby forming a switching thin film transistor and a driving thin film transistor, wherein the driving thin film transistor includes a plurality of sub-TFTs; forming a second insulating layer over the switching source and drain and the driving source and drain, wherein the second insulating layer includes a second contact hole exposing a portion of the switching drain and a third contact hole exposing a portion of the driving drain; forming a third metal layer on the second insulating layer; patterning the third metal layer to form a second driving dual gate and a power line on the second insulating layer, the power line defining the pixel region with intersections of the gate and data lines and electrically communicating with the driving source through the third contact hole, the second driving dual gate having the identical planar shape as that of the first driving dual gate and contacting the switching drain through the second contact hole; forming a third insulating layer on the second insulating layer to cover the second driving dual gate and the power line, wherein the second and third insulating layers include a fourth contact hole exposing a portion of the driving drain; forming a connection pattern on the third insulating layer to electrically communicate with the driving drain through the fourth contact hole; forming a first electrode on a second substrate; forming an organic electroluminescent layer on the first electrode; forming a second electrode on the organic electroluminescent layer within the pixel region; and attaching the second substrate having the second electrode to the first substrate having the connection pattern so as to electrically connect the driving drain to the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 13A-13F are cross sectional views taken along a line VIIa-VIIa of FIG. 6 and illustrate an exemplary fabrication process for the switching thin film transistor according to one exemplary arrangement of the present invention; and FIGS. 14A-14F are cross sectional views taken along a line VIIb-VIIb of FIG. 6 and illustrate an exemplary fabrication process for the driving thin film transistor according to one exemplary arrangement of the present invention.

DETAILED DESCRIPTION OF THE PREFERRED EMBODIMENTS

Reference will now be made in detail to the preferred embodiments of the present invention, examples of which are illustrated in the accompanying drawings.

Figure 5:
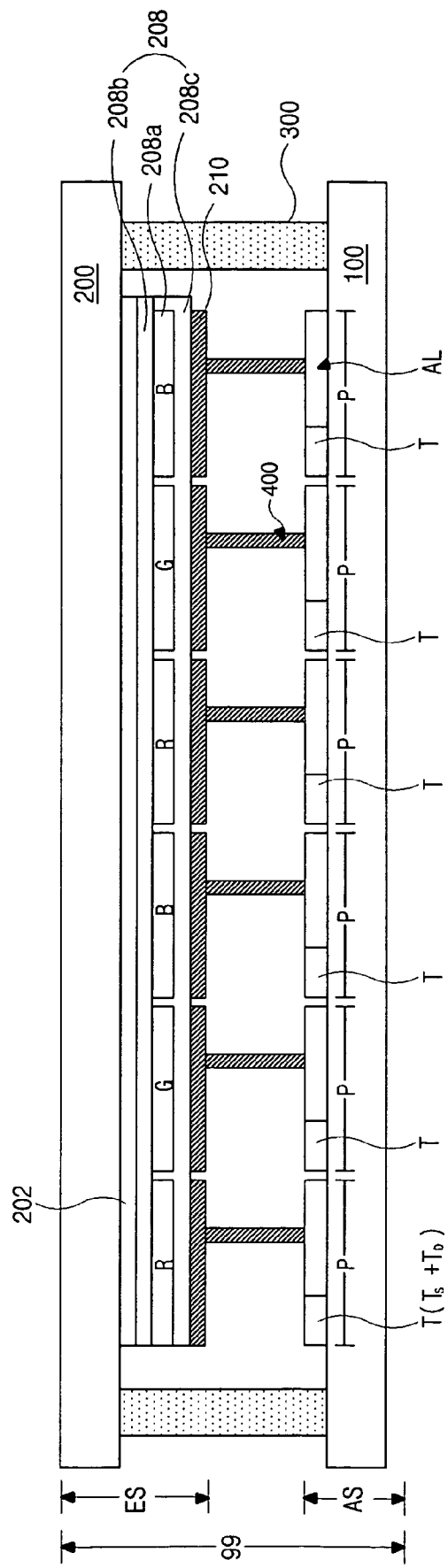
FIG. 5 is a cross sectional view of a dual panel type organic electroluminescent display (OELD) device according to an exemplary arrangement of the present invention.

FIG. 5 is a cross sectional view of a dual panel type organic electroluminescent display (OELD) device according to an exemplary arrangement of the present invention. Here, the organic electroluminescent display device 99 has two substrates AS and ES on which thin film transistors and organic electroluminescent (EL) diodes are respectively disposed.

In FIG. 5, first and second substrates AS and ES having a plurality of pixel regions P are spaced apart from each other. In the first substrate AS that is often referred to as an array substrate, an array layer AL is disposed on an inner surface of a first transparent substrate 100. The array layer AL includes switching and driving thin film transistors (TFTs) $T_S$ and $T_D$ in each pixel region P. A connection pattern 400 connected to the TFT T is formed on the array layer AL in each pixel region P. The connection pattern 400 can be made of a conductive material or multiple layers, including an insulating material with one or more layers of a conductive material, having a sufficient height for connection. An additional connection electrode can be used for connecting the connection pattern 400 and the TFT T. The TFT T includes the inventive driving TFT TD that will be described with reference to FIGS. 6-14 hereinafter. The connection pattern 400 is connected to the driving drain of the driving TFT TD.

In the second substrate ES (i.e., an emitting substrate), a first electrode 202 is disposed on an inner surface of a second transparent substrate 200. An organic electroluminescent (EL) layer 208 including red (R), green (G) and blue (B) organic emission layers 208a alternately disposed in each pixel region P is disposed on the first electrode 202. A second electrode 210 is disposed on the organic EL layer 208 within each pixel region P. The organic EL layer 208 can be formed of a single layer or of multiple layers. In the case of multiple layers, the organic EL layer 208 may include a first carrier-transporting layer 208b on the first electrode 202, red (R), green (G) and blue (B) emission layers 208a on the first carrier-transporting layer 208b, and a second carrier-transporting layer 208c on each of the emission layers 208a. For example, when the first and second electrodes 202 and 210 are respectively an anode and a cathode, the first carrier-transporting layer 208b corresponds to a hole-injecting layer and a hole-transporting layer, and the second carrier-transporting layer 208c corresponds to an electron-transporting layer and an electron-injecting layer. The first and second electrodes, 202 and 210, and the organic EL layer 208 interposed therebetween define an organic EL diode.

The first and second substrates 100 and 200 are attached with a sealant 300 at a peripheral portion thereof. A top surface of the connection pattern 400 contacts a bottom surface of the second electrode 210, so that a current of the driving TFT TD is flowing into the second electrode 210 through the connection pattern 400.

Figure 8:
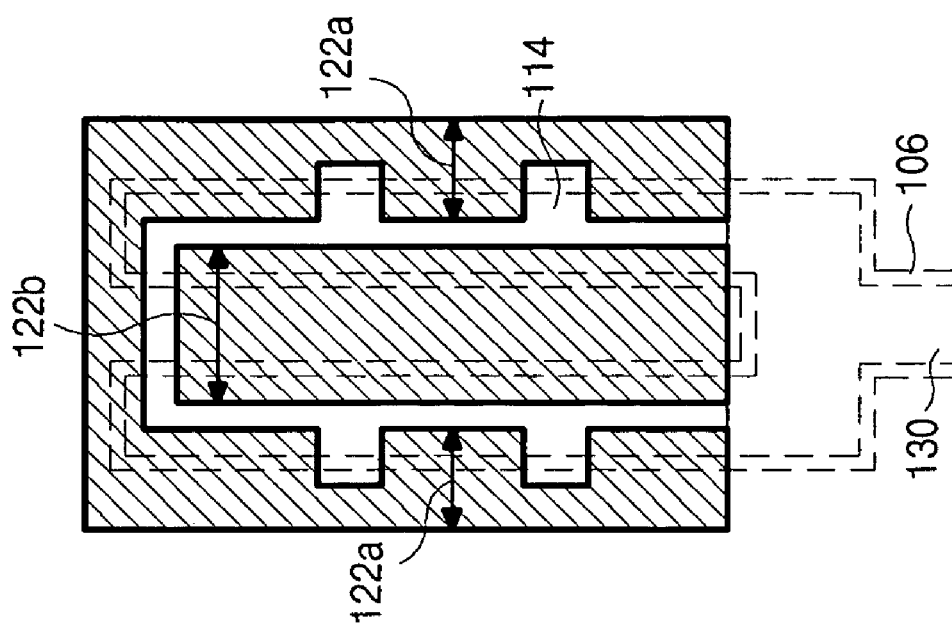
FIGS. 8-12 are plan views showing exemplary shapes of the driving source and drain according to the present invention.

As shown in FIG. 8, an organic electroluminescent display (OELD) device is a dual panel type where an array layer AL and an organic EL diode are formed on different substrates and where a connection pattern 400 electrically connects the array layer AL to the organic EL diode. The TFTs T of FIG. 8 can be fabricated through the process described in FIGS. 13A-13F and 14A-14F, and various modifications and variations can be made in the structure of the driving TFT $T_D$ as shown in FIGS. 8-12. Moreover, since the OELD device of FIG. 8 is a top emission type, the thin film transistors T can be easily designed to obtain a high resolution and high aperture ratio.

Figure 6:
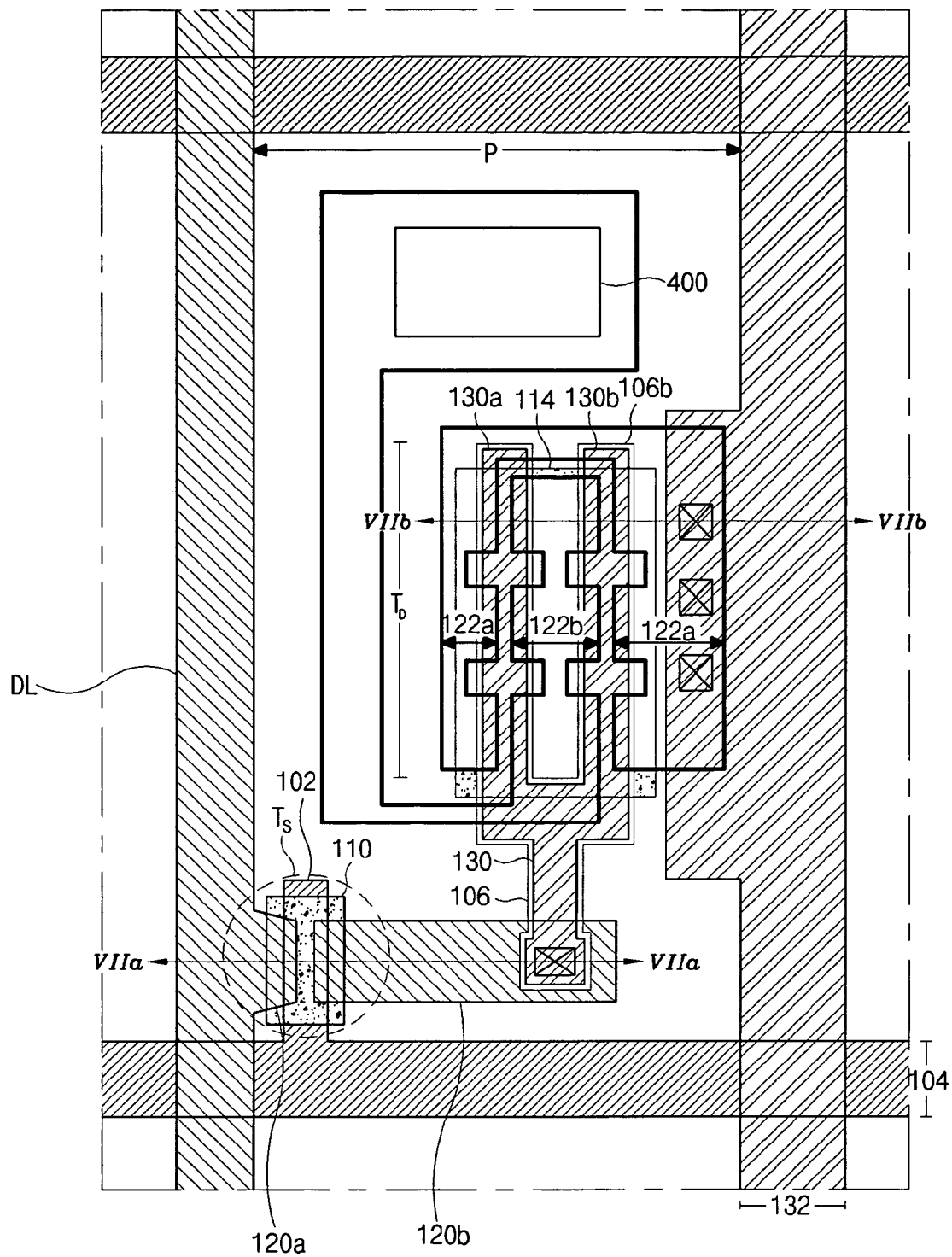
FIG. 6 is a schematic plan view of a pixel of an exemplary array substrate according to the present invention.
Figure 7A:
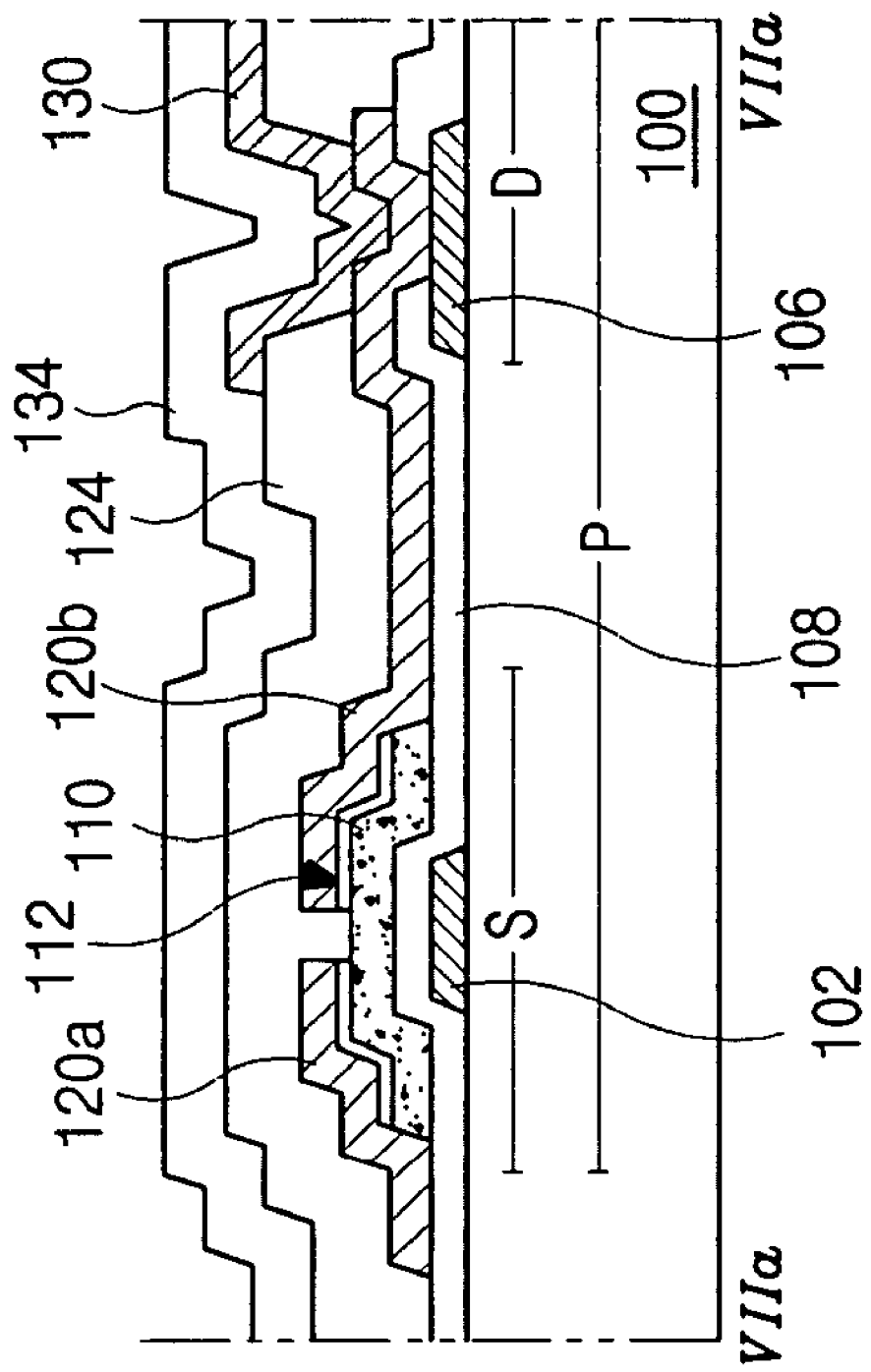
FIGS. 7A and 7B are cross sectional views taken along lines VIIa-VIIa and VIIb-VIIb of FIG. 6 illustrating switching and driving thin film transistors, respectively.
Figure 7B:
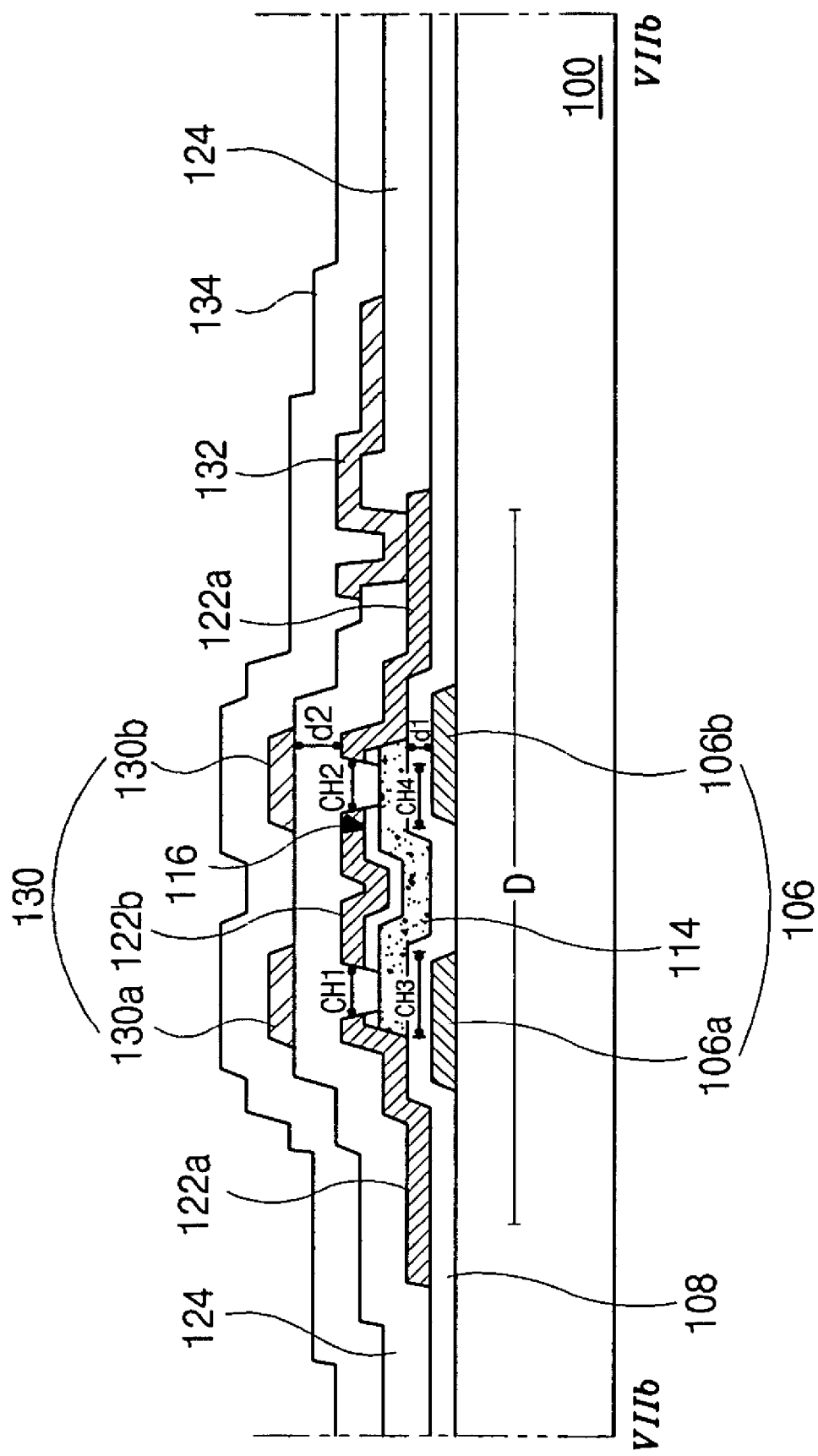

FIG. 6 is a schematic plan view of a pixel of an exemplary array substrate according to the present invention. FIGS. 7A and 7B are cross sectional views taken along lines VIIa-VIIa and VIIb-VIIb of FIG. 6 illustrating switching and driving thin film transistors, respectively. The array substrate of FIGS. 6 and 7A-7B is adopted for a top emission type active matrix OELD device of FIG. 5.

In FIGS. 6 and 7A-7B, a gate line 104 intersects a data line DL and a power line 132, which are spaced apart from each other. A pixel region P is defined by the intersections of the gate line 104 and the data and power lines DL and 132. A switching thin film transistor (TFT) $T_S$ is disposed adjacent to a portion of pixel region P where the gate line 104 and the data line DL intersects each other. A driving thin film transistor (TFT) $T_D$ is disposed in the pixel region P next to the power line 132. The driving TFT $T_D$ in this arrangement is a transistor system that includes a plurality of parallel-connected sub-TFTs. Also, the driving TFT $T_D$ of FIG. 6 has a quad gate system where one dual gate overlaps the other dual gate.

In FIGS. 6 and 7A, the switching TFT $T_S$ includes a switching gate 102 extending from the gate line 104, a switching source 120a extending from the data line DL, a switching drain 120b spaced apart from the switching source 120a, and a switching active layer 110 above the switching gate 102. The switching active layer 110 is formed of amorphous silicon and has an island shape. A first insulating layer 108 is interposed between the switching gate 102 and the switching active layer 110. A switching ohmic contact layer 112 is formed on the switching active layer 110, and the switching source and drain 120a and 120b are formed to contact the ohmic contact layer 112. The first insulating layer 108 has a first contact hole that exposes one end portion of a first driving dual gate 106, such that the switching drain 120b contacts the first driving dual gate 106 within the first contact hole defined through the first insulating layer 108. A second insulating layer 124 overlaps the switching TFT $T_S$, and has a second contact hole that exposes one end portion of the switching drain 120b. The second contact hole defined through in the second insulating layer 124 may correspond in position to the first contact hole. A second driving dual gate 130 of the driving TFT $T_D$ is formed on the second insulating layer 124 and contacts the switching drain 120b within the second contact hole defined through the second insulating layer 124. The switching drain 120b communicates with both the first and second driving dual gates 106 and 130. A third insulating layer 134 is disposed on the second insulating layer 124 and covers the second driving dual gate 130.

In FIGS. 6 and 7B, the driving TFT $T_D$ has a first driving dual gate 106, a driving active layer 114, a driving ohmic contact layer 116, a driving source 122a, a driving drain 122b, and a second driving dual gate 130. The first driving dual gate 106 is disposed on a substrate 100 and has a substantially "Y" shaped pattern including a first arm 106a and a second arm 106b. The first and second arms 106a and 106b of the first driving dual gate 106 elongate along side the power line 132. The first insulating layer 108 having a first thickness d1 is formed on the substrate 100 and covering the first driving dual gate 106. As described before, the first driving dual gate 106 electrically communicates with the switching drain 120b within the first contact hole defined through the first insulating layer 108. The driving active layer 114 is disposed on the first insulating layer 108 and has an island pattern shape overlapping the first driving dual gate 106. The driving ohmic contact layer 116 is disposed on the diving active layer 114. The driving active layer 114 is formed of undoped amorphous silicon, while the driving ohmic contact layer 116 is formed of doped amorphous silicon. The driving drain 122b is disposed over the first driving dual gate 106 and has first and second portion. The first portion of the driving drain 122b is positioned between the first and second arms 106a and 106b of the first driving dual gate 106, and contacting the driving ohmic contact layer 116. The second portion of the driving drain 122b extends from the first portion of the driving drain 122b into the residual space of the pixel region P, whereby the connection pattern 400 is disposed on the second portion of the driving drain 122b. In addition, the driving drain 122b overlaps inner portions of the first and second arms 106a and 106b.

As shown in FIGS. 6 and 7B, the driving source 122a is disposed on the first insulating layer 108 and overlaps edge portions of the driving ohmic contact layer 116, and has a substantially "U" shaped pattern. In addition, the driving source 122a is spaced apart form the driving drain 122b, surrounds the first portion of the driving drain 122b, and overlaps outer portions of the first and second arms 106a and 106b of the first driving dual gate 106. The second insulating layer 124 is disposed to cover the driving source 122a and the driving drain 122b, and has a third contact hole that exposes a portion of the driving source 122a. The second insulating layer 124 has a second thickness d2 that may be greater than the first thickness d1 of the first insulating layer 108. The power line 132 is disposed on the second insulating layer 124 and contacts the driving source 122a within the third contact hole defined through the second insulating layer 124. The power line 132 is spaced apart from the data line DL, as shown in FIG. 6, and perpendicularly intersects the gate line 104.

The second driving dual gate 130 is also disposed on the second insulating layer 124 and overlaps the first driving dual gate 106. The second driving dual gate 130 has the same planar shape with the first driving dual gate 106, such that the second driving dual gate 130 has a third arm 130a and a fourth arm 130b overlapping the first and second arms 106a and 106b of the first driving dual gate 106. The power line 132 and the second driving dual gate 130 are formed of the identical material to each other in a same process.

Figure 1:
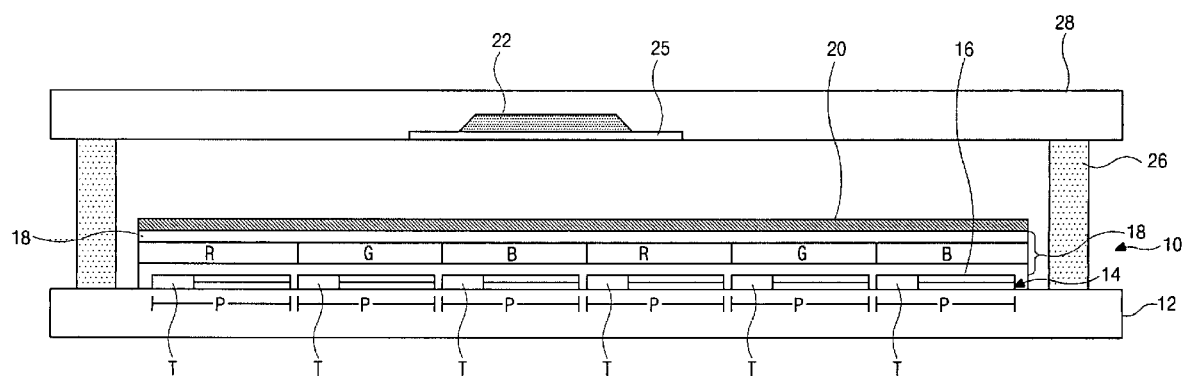
FIG. 1 is a schematic cross-sectional view illustrating an active matrix type organic electroluminescent display device according to a related art arrangement.
Figure 2:
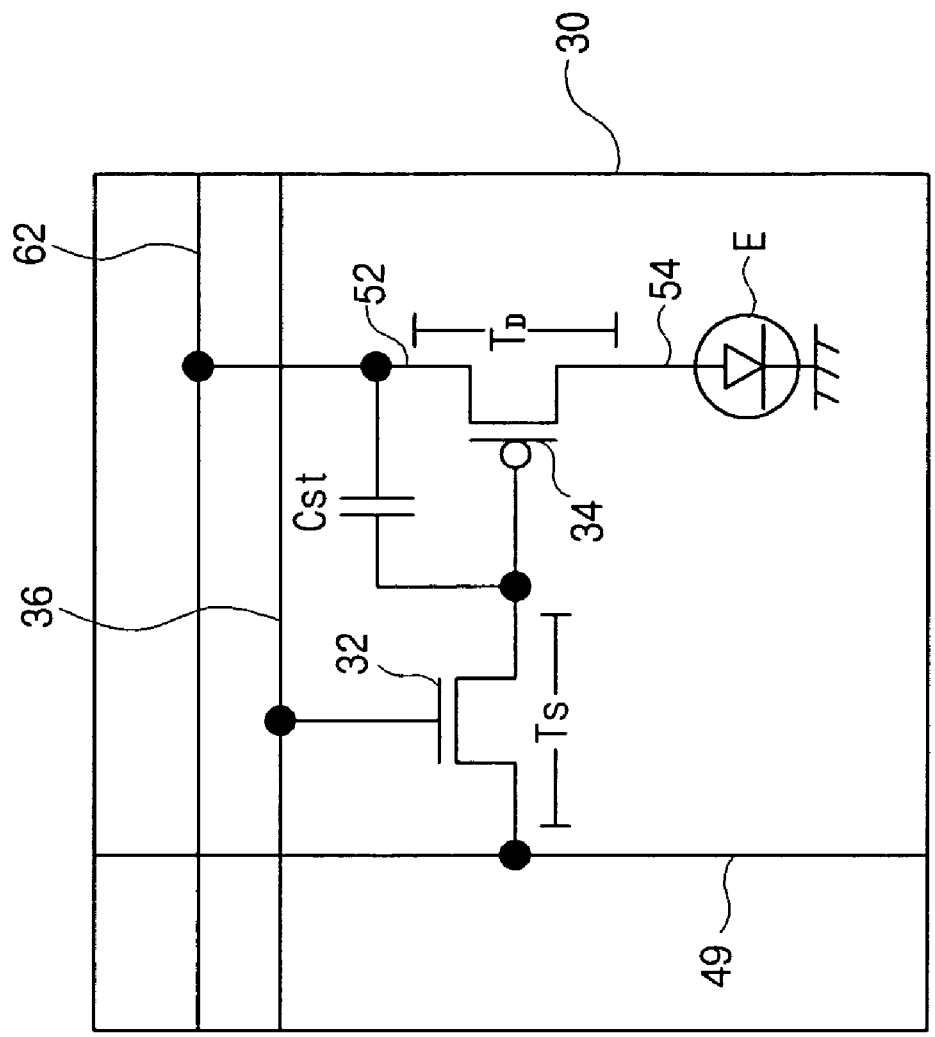
FIG. 2 is an equivalent circuit diagram illustrating a pixel of the organic electroluminescent display device according to the related art arrangement.
Figure 3:
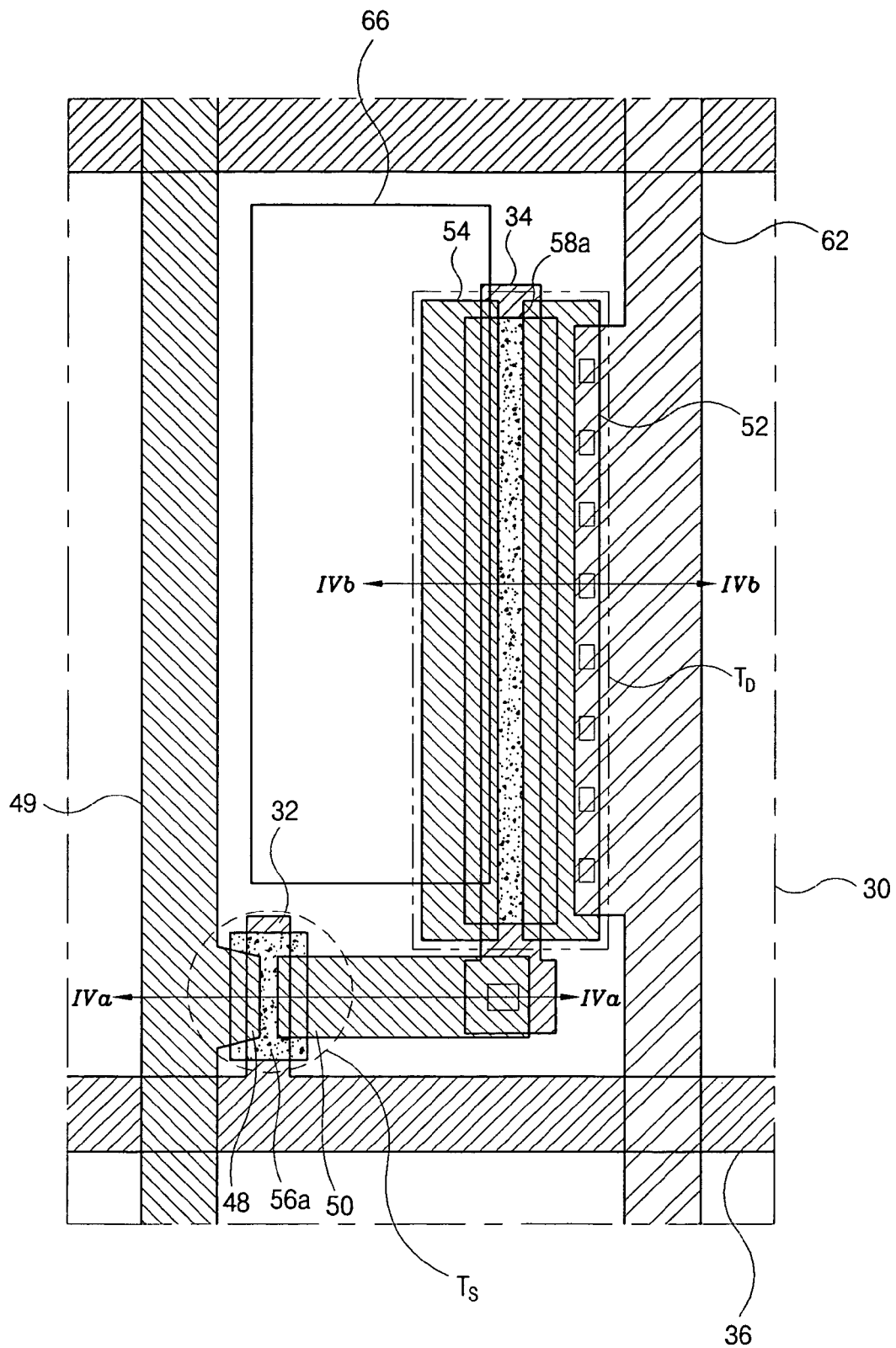
FIG. 3 is a schematic plan view of an active matrix organic electroluminescent display device having a bottom emission type according to the related art.
Figure 4A:
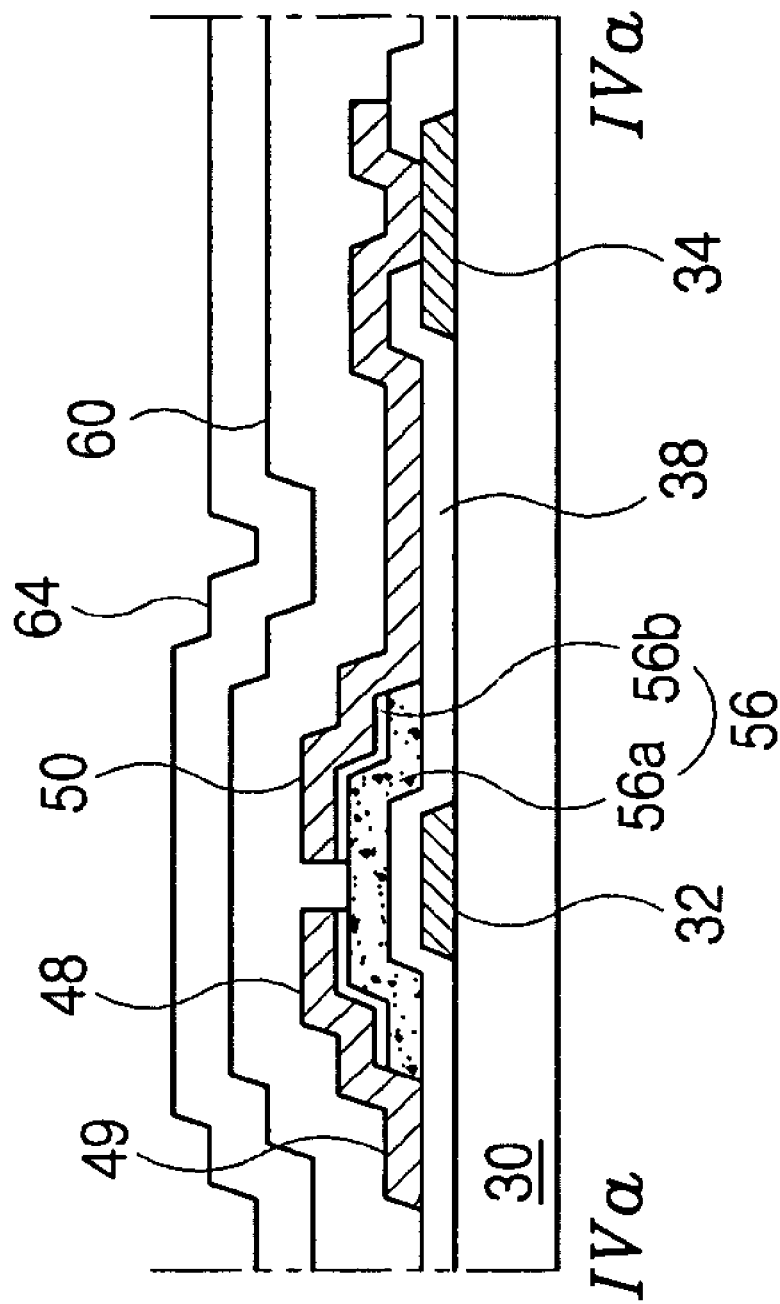
FIGS. 4A and 4B are cross sectional views taken along lines IVa-IVa and IVb-IVb of FIG. 3 illustrating the switching thin film transistor and the driving thin film transistor, respectively.
Figure 4B:
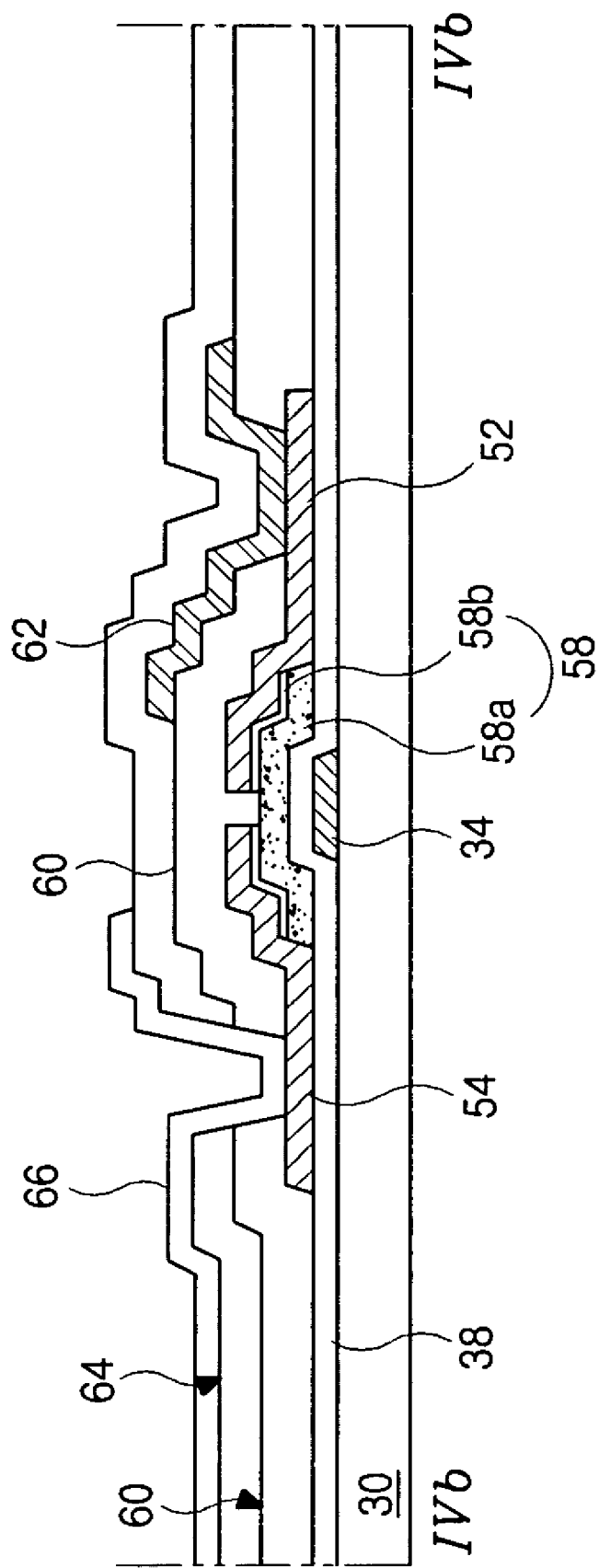

As mentioned before, the second driving dual gate 130 contacts the switching drain 120b within the second contact hole defined through the second insulating layer 124. The third insulating layer 134 is disposed on the second insulating layer 124 with covering the second driving dual gate 130 and the power line 132. Although not shown in FIGS. 6 and 7A-7B, the second and third insulating layers 124 and 134 may have a fourth contact hole that exposes a portion of the driving drain 122b so as to connect the connection pattern 400 to the driving drain 122b. Unlike the related art shown in FIGS. 3 and 4A-4B, the driving TFT $T_D$ includes two driving dual gates 106 and 130 each having two arms, the U-shaped driving source 122a, and the driving drain 122b having the first and second portions, wherein the first portion of the driving drain 122b is disposed between the two arms 106a (or 130a) and 106b (or 130b) of one of the first and second driving dual gates 106 and 130, and surrounded by the U-shaped driving source 122a.

Referring to FIG. 6, left and right inner portions of the driving source 122a includes a plurality of indentations such that, the locations of the indentations along the left inner portion correspond to the ones along the right inner portion. In addition, the driving drain 122b includes a plurality of indentations along the side portions surrounded by the U-shaped driving source 122a. The plurality of indentations formed by the driving source 122a and driving drain 122b are positioned corresponding to each other and forming the sub-TFTs that are connected in parallel. Furthermore, since two driving dual gates 106 and 130 are present underneath and above the driving active layer 114, respectively, the driving TFT $T_D$ can include more sub-TFTs connected in parallel. The driving TFT $T_D$ of the present invention is made up of the plurality of parallel-connected sub-TFTs that are sectionalized by the indentations formed along the side portions of the driving source 122a and drain 122b, and by the first and second driving gates 106 and 130.

Meanwhile, the indented shape of the driving source 122a and drain 122b can include various shapes according to their application. The variation of the indented shape will be explained with reference to FIGS. 8-12.

FIGS. 8-12 are plan views showing exemplary shapes of the driving source and drain according to the present invention. In FIGS. 8-12, the first and second driving dual gates 106 and 130 are depicted by dotted lines.

In FIG. 8, the driving source 122a has a "U" shape and surrounds the driving drain 122b. The driving source 122a has indentations in both left and right inner portions, wherein the locations of the indentations along the left inner portion correspond to the ones along the right inner portion. However, unlike the driving source 122a, the driving drain 122b does not have such indentations.

Figure 9:
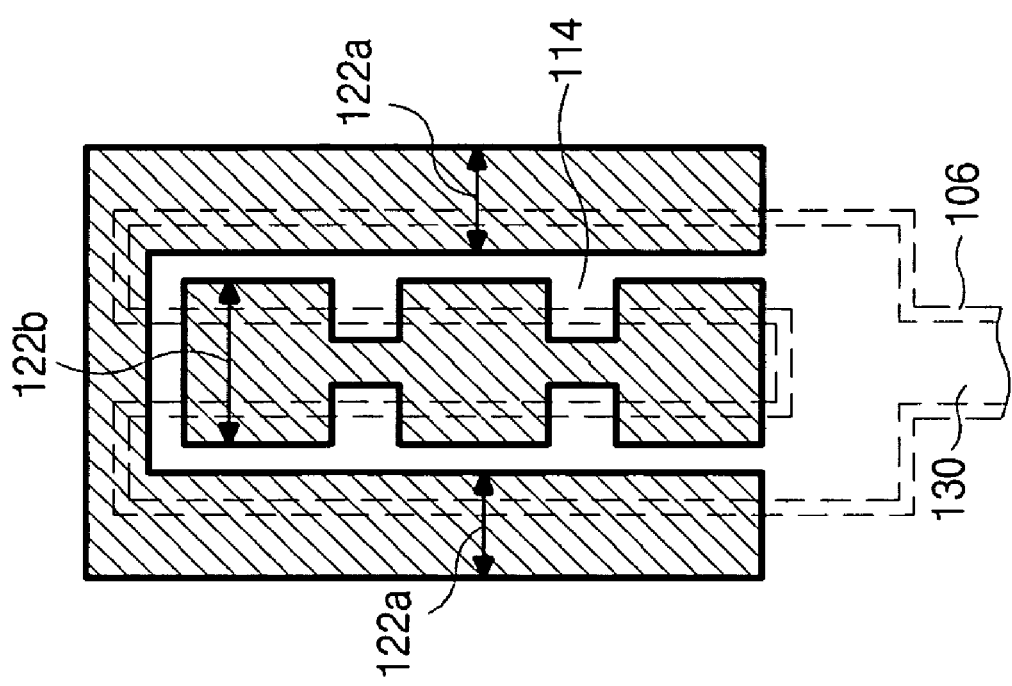

In FIG. 9, the driving drain 122b has indentations in left and right side portions, wherein the indentations of the left side portion correspond to those of the right side portion. Furthermore, the driving source 122a has a "U" shape surrounding the driving drain 122b, however, it does not have any indentations.

Figure 10:
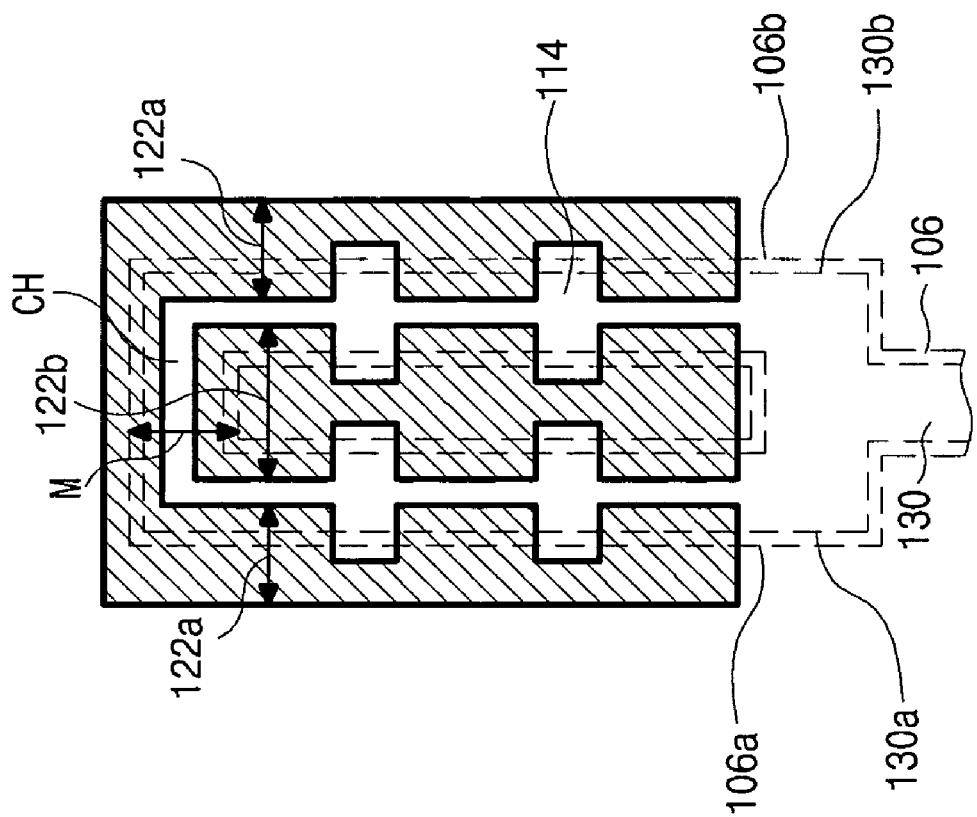

In FIG. 10, the driving source 122a and drain 122b have the similar shapes to those shown in FIG. 6, but the first and second 106 and 130 are different from those previously shown. As depicted by dotted lines, the first and second arms 106a and 106b are connected in a portion M, and the third and fourth arms 130a and 130b are also connected therein. Accordingly, a channel CH is further formed over the portion M where the first and second arms 106a and 106b are connected to each other and where the third and fourth arms 130a and 130b are connected to each other if the driving active layer 114 exists in the portion M. The channel CH is enlarged although the number of the sub-TFTs is not changed.

Figure 11:
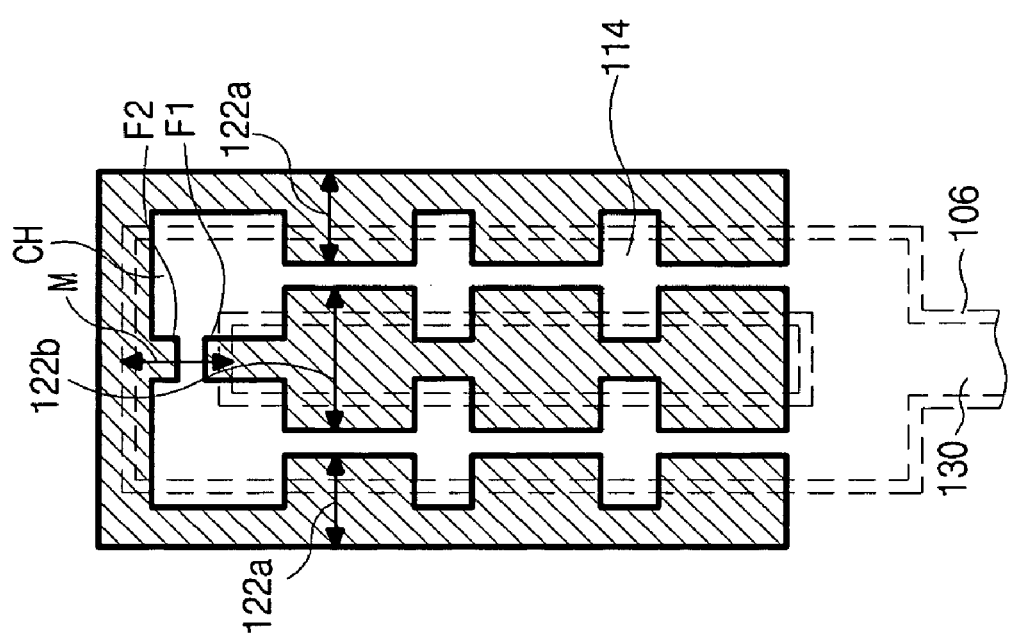

In FIG. 11, the driving drain 122b has a first protrusion F1 in the portion M wherein the arms 106a (or 130a) and 106b (or 130b) of the driving dual gate 106 (or 130) are connected to each other. Also, the driving source 122a has a second protrusion F2 at a location corresponding to the first protrusion F1. Furthermore, the driving source 122a and drain 122b has indentions in the portion M. Therefore, the driving TFT $T_p$ can have much wider channel region CH and more sub-TFTs.

Figure 12:
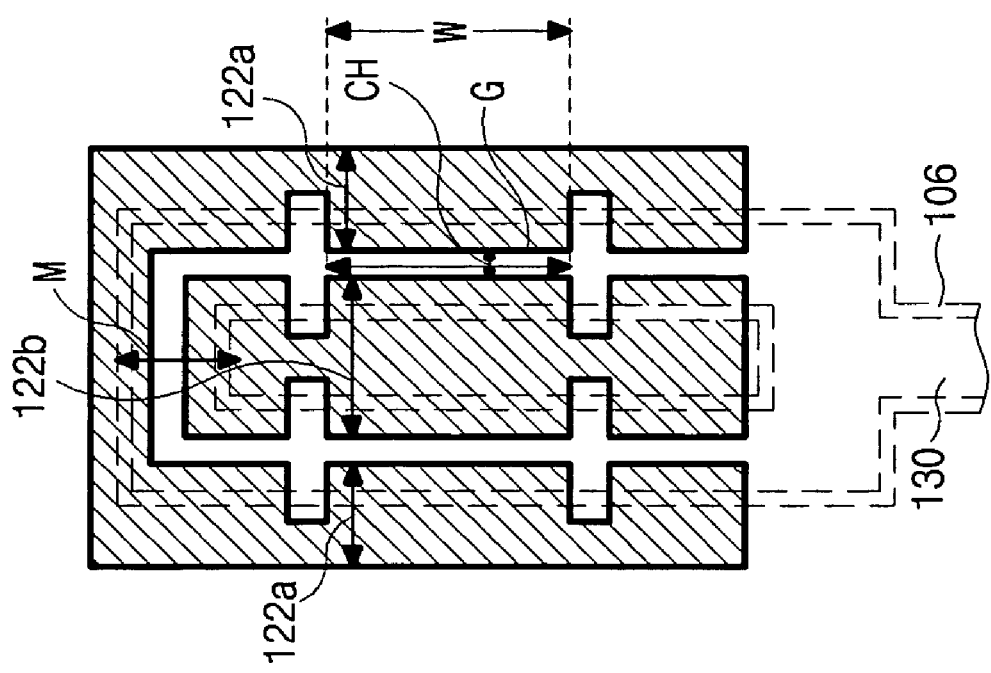

In FIG. 12, the driving source 122a and drain 122b have indentations similar to those of FIG. 10, but each indention of the driving source 122a and drain 122b has narrower width than that of FIG. 10. Therefore, each protrusion G of the driving source 122a and drain 122b has relatively larger width W as compared to that of FIG. 10. As a result, the channel CH between the driving source 122a and drain 122b is possible to have relatively wider width W.

According to FIGS. 8-12, the driving source 122a and drain 122b are disposed between the first and second driving dual gates 106 and 130 when viewed in a cross sectional view. In addition, the driving active layer 114 is disposed between the first and second driving gates 106 and 130 to form the channel CH thereon. Accordingly, having more indentations increases the number of sub-TFTs.

FIGS. 13A-13F are cross sectional views taken along line VIIa-VIIa of FIG. 6 illustrating an exemplary fabrication process of the switching thin film transistor according to one exemplary arrangement of the present invention. FIGS. 14A-14F are cross sectional views taken along line VIIb-VIIb of FIG. 6 illustrating the exemplary fabrication process of the driving thin film transistor according to one exemplary arrangement of the present invention.

Figure 13A:
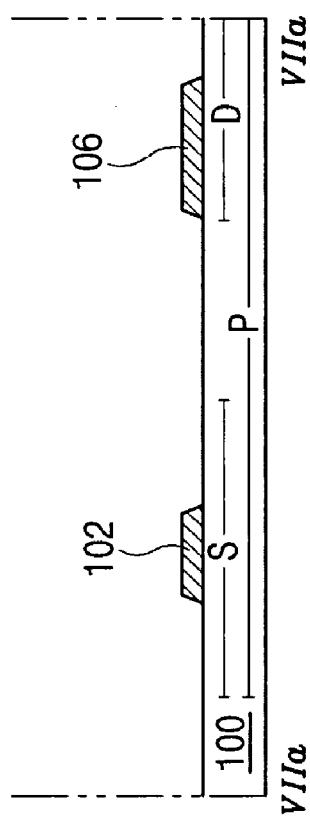
Figure 14A:
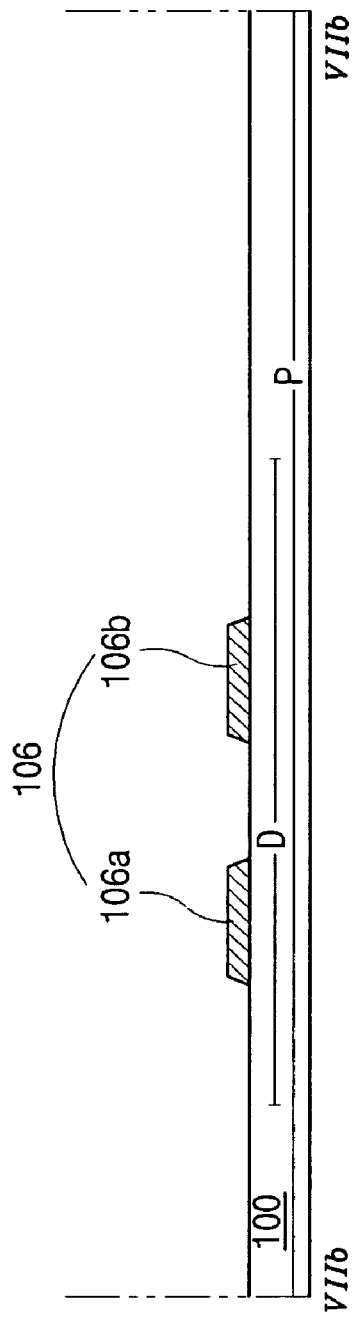

In FIGS. 13A and 14A, a substrate 100 having a switching region S, a driving region D and a pixel region P is provided. Thereafter, a first metal layer is disposed on the substrate 100. The first metal layer may be formed of aluminum (Al), tungsten (W), copper (Cu), molybdenum (Mo), titanium (Ti), aluminum neodymium (AlNd) or other suitable alloys. The first metal layer is then patterned to form a gate line (reference 104 of FIG. 6), a switching gate 102, and a first driving dual gate 106. The gate line is disposed in a first direction, and the switching gate extends from the gate line and is disposed in the switching region S. The first driving dual gate 106 is disposed in the driving region D, and includes first and second arms 106a and 106b that are connected at one or both ends thereof. The switching gate 102 and the first driving dual gate 106 may be elongated in a second direction perpendicular to the gate line in the pixel region P, as shown in FIG. 6.

Figure 13B:
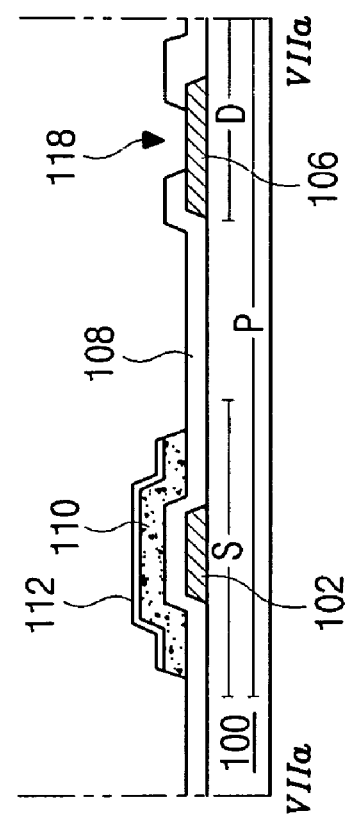
Figure 14B:
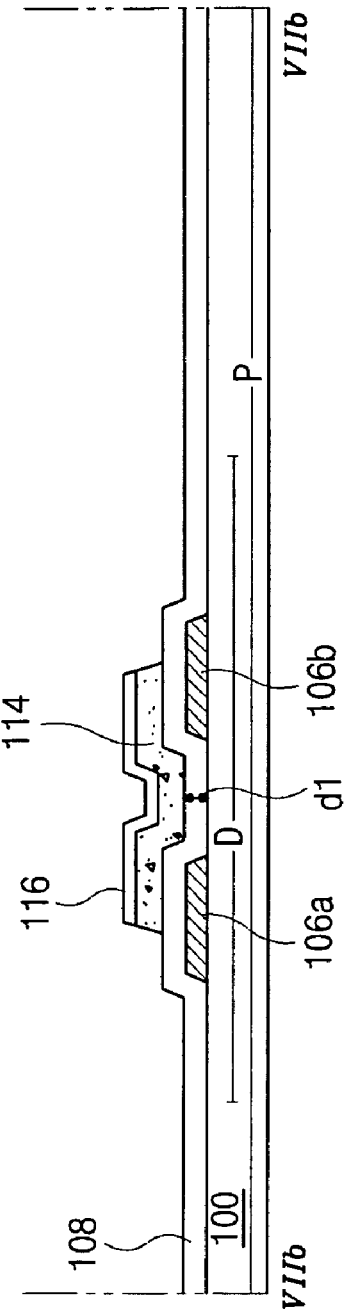

After patterning the first metal layer, a first insulating layer 108 is disposed on the entire resultant surface of the substrate 100 to cover the gate line, the switching gate 102 and the first driving dual gate 106, as shown in FIGS. 13B and 14B. The first insulating layer 108 may be formed of an inorganic material, such as, silicon nitride (SiNX) and silicon oxide (SiO2), and has a first thickness d1. After disposing the first insulating layer 108, an undoped amorphous silicon (a-Si:H) layer and a doped amorphous (n+ a-Si:H) silicon layer are sequentially disposed on the first insulating layer 108 and then patterned, thereby forming a switching active layer 110 and a switching ohmic contact layer 112, a driving active layer 114 and a driving ohmic contact layer 116 on the first insulating layer 108. Of course, other suitable materials may be used. However, the active layers are generally the undoped amorphous silicon, and include the switching active layer 110 and the driving active layer 114. The ohmic contact layers are generally the doped amorphous silicon and include the switching ohmic contact layer 112 and the driving ohmic contact layer 116. The switching active and ohmic contact layers 110 and 112 correspond to the switching gate 102, and the driving active and ohmic contact layers 114 and 116 to the first driving dual gate 106, respectively. Especially, the driving active and ohmic contact layers 114 and 116 may overlap the first and second arms 106a and 106b of the first driving dual gate 106. Then, the first insulating layer 108 is patterned to define a first contact hole 118 that exposes one end of the first driving dual gate 106.

Figure 13C:
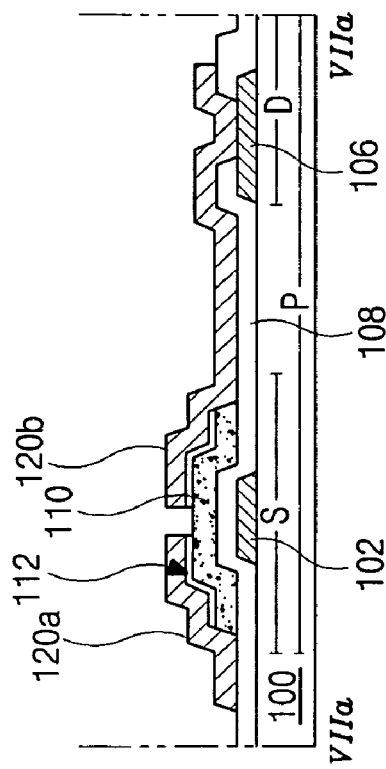

In FIGS. 13C and 14C, a second metal layer is disposed over the entire resultant surface of the first insulating layer 108 to cover the active layers 110 and 114 and the ohmic contact layers 112 and 116, and then patterned to form switching and driving sources 120a and 122a and switching and driving drains 120b and 122b. In addition, the data line (reference DL of FIG. 6) perpendicularly intersecting the gate line is disposed simultaneously, when forming the switching source and drain 120a and 120b and the driving source and drain 122a and 122b. Each of the sources 120a and 122a is spaced apart from the corresponding drain 120b and 122b. The switching source and drain 120a and 120b are formed to contact the switching ohmic contact layer 112, and the switching drain 120b contacts the first driving dual gate 130 within the first contact hole 118. The driving source and drain 122a and 122b are also formed to contact the driving ohmic contact layer 116.

As mentioned with reference to FIG. 6, the driving drain 122b has a first portion that is disposed in an area between the first and second arms 106a and 106b of the first driving dual gate 106, and a second portion that extends from the first portion into the other portion of the pixel region P. The first portion of the driving drain 122b overlaps the inner portions of the first and second arms 106a and 106b of the first driving dual gate 106. Furthermore, the driving source 122a has the "U" shape and surrounds the first portion of the driving drain 122b, as shown in FIGS. 6 and 8-12. Moreover, the driving source and drain 122a and 122b may include a plurality of indentations and protrusions, wherein the locations of the indentations of the driving source 122a may correspond to the locations of the indentations of the driving drain 122b, as shown in FIGS. 8-12. The U-shaped driving source 122a overlaps the outer portions of the first and second arms 106a and 106b of the first driving dual gate 106.

After patterning the second metal layer, portions of the switching and driving ohmic contact layers 112 and 116, which are exposed between the switching source and drain 120a and 120b and between the driving source and drain 122a and 122b, are removed to form channels in the underlying switching and driving active layers 110 and 114. Thus, a switching TFT and a driving TFT are complete in the switching and driving regions S and D, respectively. Meanwhile, the switching TFT is connected to the driving TFT via the switching drain 120b and the driving gate 106. Furthermore, the driving TFT may have a plurality of sub-TFTs connected in parallel to each other, due to the indentations and protrusions formed in the driving source and drain and the first driving dual gate 106.

Figure 13D:
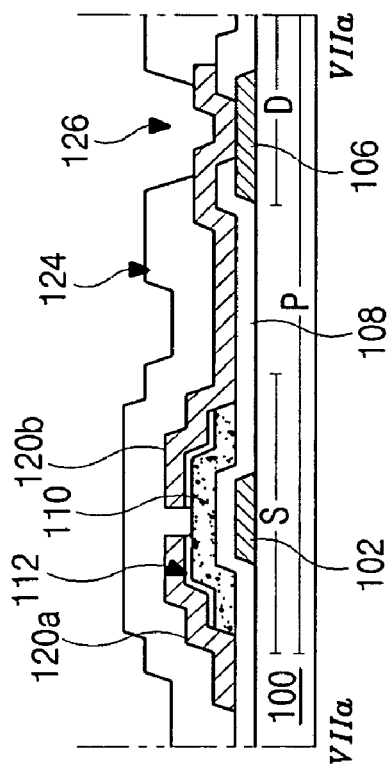

In FIGS. 13D and 14D, a second insulating layer 124 is disposed over the entire surface of the substrate 100 to cover the switching source 120*a* and drain 120*b* and the driving source 122*a* and drain 122*b*. Then, the second insulating layer 124 is patterned to define second and third contact holes 126 and 128. The second contact hole 126 may expose a portion of the switching drain 120*b*, and may correspond to the first contact hole 118 defined through the first insulating layer 108. The third contact hole 128 exposes a portion of the driving source 122*a*. As shown in FIG. 6, there may be more than one third contact holes 128 in the second insulating layer 124 so as to connect the power line 132 to the driving source 122*a*. The second insulating layer 124 may have a second thickness d2 that is greater than the first thickness d1 of the first insulating layer 108.

Figure 14E:
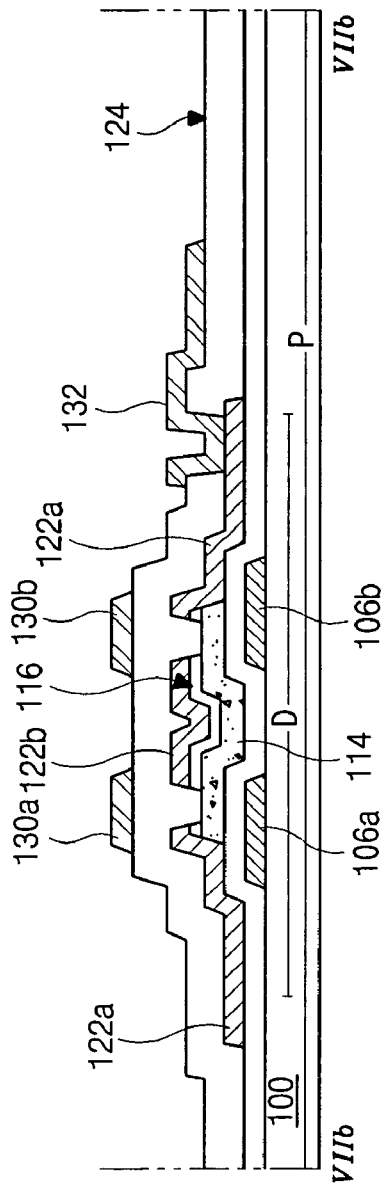

Thereafter, a third metal layer is disposed over the entire surface of the second insulating layer 124 and then patterned to form a second driving dual gate 130 as well as a power line 132, as shown in FIGS. 13E and 14E. The power line 132 is disposed in the second direction perpendicular to the gate line (reference 104 of FIG. 6) and spaced apart from the data line (reference DL of FIG. 6). The second driving dual gate 130 includes third and fourth arms 130*a* and 130*b* and has the same planar shape as the first driving dual gate 106, whereby the third and fourth arms 130*a* and 130*b* overlap the first and second arms 106*a* and 106*b* of the first driving dual gate 106. One end of the second driving dual gate 130 contacts the switching drain 120*b* within the second contact hole 126, and the power line 132 contacts the driving source 122*a* within the third contact hole 128. Therefore, the switching drain 112*b* of the switching TFT is connected to both the first and second driving dual gates 106 and 130 of the driving TFT. Meanwhile, the driving TFT of FIG. 14E additionally includes a plurality of sub-TFTs that are also connected in parallel and include the second driving dual gate 130, the driving active layer 114, the driving ohmic contact layer 116, the driving source 122*a* and the driving drain 122*b*.

Moreover, the second insulating layer 124 is disposed to have the second thickness d2 that is greater than the first thickness d1 of the first insulating layer 108. Therefore, the second insulating layer 124 having the second thickness d2 may prevent the signal interference between the first and second dual gates 106 and 130. Furthermore, since there are two diving dual gates 106 and 130, the driving TFT can have a much wider channel width compared to a channel length.

Figure 14F:
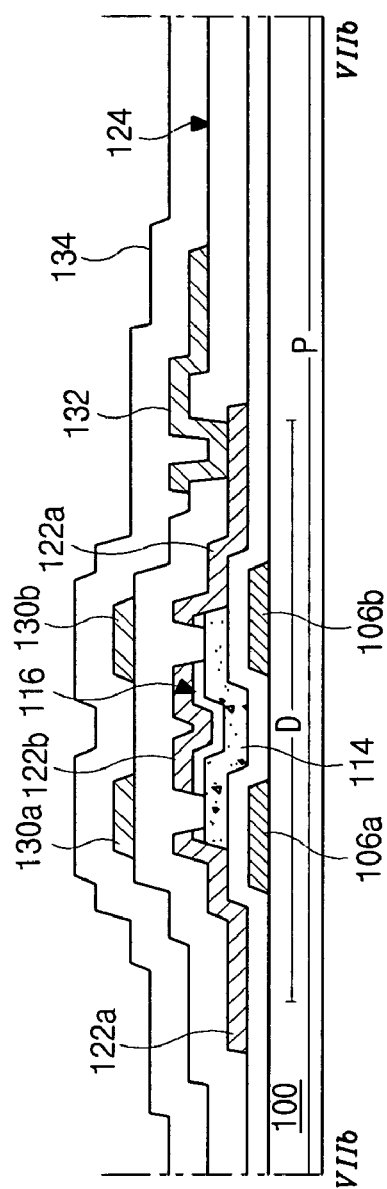

In FIGS. 13F and 14F, a third insulating layer 134 is disposed over the second insulating layer 124 to cover the second driving dual gate 130 and the power line 132. The third insulating layer 134 may be an inorganic material, such as, silicon nitride (SiNX) and silicon oxide (SiO2), or an organic material, such as, benzocyclobutene (BCB) and acrylic resin. Although not shown in FIGS. 13F and 14F, but shown in FIG. 6, the second and third insulating layers 124 and 134 may be simultaneously patterned to define a fourth contact hole exposing a portion of the second portion of the driving drain 122*b*, whereby the connection pattern 400 may be disposed on the third insulating layer 134 to contact the driving drain 122*b*.

As shown in FIGS. 13A-13F and 14A-14F, the array substrate having array layers is fabricated. Then, the emitting substrate that includes the organic electroluminescent diode is attached to the array substrate by the sealant, thereby forming the dual panel type organic electroluminescent display (OELD) device of the present invention.

Accordingly, the present invention has a number of advantages. For example, the driving TFT has a wider channel width and a shorter channel length, and the driving TFT can efficiently operate and drive the organic electroluminescent diode. Furthermore, although a large amount of current flows through the driving thin film transistor, the current stress may abate in the driving TFT because the driving TFT has parallel-connected sub-TFTs. Thus, the driving TFT is undamaged and operable for an extended period of time. Moreover, since the organic electroluminescent display device is a top emission type, achieving the increased aperture ratio and the increased resolution promising the excellent display of quality is possible.

It will be apparent to those skilled in the art that various modifications and variations can be made in the organic electroluminescent display device and method of fabricating an organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   a gate line on a first substrate;
   a data line intersecting the gate line on the first substrate;
   a switching thin film transistor at the intersection of the gate line and data line;
   a driving thin film transistor having a first driving dual gate, a driving active layer over the first driving dual gate, a driving source, a driving drain, and a second driving dual gate over the driving active layer, and the driving thin film transistor connected to the switching thin film transistor;
   an organic electroluminescent diode on a second substrate; and
   a connection pattern connecting the driving drain and the organic electroluminescent diode between the first and second substrates,
   wherein the first driving dual gate overlaps the second driving dual gate, and the first and second driving dual gates cover a portion of the driving active layer exposed between the driving source and the driving drain.

2. The device according to claim 1, wherein the switching thin film transistor includes an amorphous silicon active layer, a switching gate extending from the gate line, a switching source extending from the data line, and a switching drain spaced apart from the switching source.

3. The device according to claim 1, wherein the driving active layer is formed of amorphous silicon.

4. The device according to claim 1, wherein the first driving dual gate includes first and second arms on the first substrate, and the second driving dual gate includes third and fourth arms overlapping the first and second arms, respectively.

5. The device according to claim 1, further comprising a first insulating layer on the first substrate, wherein the first insulating layer covers the first dual gate and has a first thickness.

6. The device according to claim 5, further comprising a second insulating layer covering the switching thin film transistor, the driving source and the driving drain, wherein the second insulating layer has a second thickness that is greater than the first thickness.

7. The device according to claim 6, wherein the first and second driving dual gates is connected to the switching thin film transistor through a first contact hole defined through the first insulating layer and through a second contact hole defined through the second insulating layer, respectively.

8. The device according to claim 6, wherein the second driving dual gate is disposed on the second insulating layer and has the identical planar shape as that of the first driving dual gate.

9. The device according to claim 1, further comprising a third insulating layer covering the switching and driving thin film transistors.

10. The device according to claim 1, further comprising a power line disposed perpendicular to the gate line, wherein the power line contacts the driving source.

11. The device according to claim 1, wherein the organic electroluminescent diode includes a first electrode on the second substrate, an organic electroluminescent layer on the first electrode, and a second electrode on the organic electroluminescent layer, wherein the organic electroluminescent layer includes red, green and blue organic emission layers.

12. The device according to claim 1, wherein the driving drain includes a first portion on the driving active layer and a second portion extending out from thin film transistor regions.

13. The device according to claim 12, wherein the driving source includes a substantially "U" shaped-opening that surrounds the first portion of the driving drain.

14. The device according to claim 1, wherein both of the driving source and drain include a plurality of indentations and protrusions so as to form a plurality of sub-TFTs connected in parallel.

15. The device according to claim 14, wherein the indentations of the driving source correspond to the respective indentions of the driving drain, and wherein the protrusions of the driving source correspond to the respective protrusions of the driving drain.

16. The device according to claim 1, wherein the driving source includes a plurality of indentations and protrusions so as to form a plurality of sub-TFTs connected in parallel, and wherein the indentations and protrusions face the corresponding indentations and protrusions, respectively.

17. A method of fabricating an organic electroluminescent display device including pixels each having a pixel region, a switching region and a driving region, the method comprising:

forming a first metal layer on a first substrate;
patterning the first metal layer to form a gate line, a switching gate in the switching region, and a first driving dual gate in the pixel region;
forming a first insulating layer on the first substrate to cover the gate line, the switching gate, the first driving dual gate;
forming a switching active layer on the first insulating layer over the switching gate and a driving active layer on the first insulating layer over the first diving dual gate;
patterning the first insulating layer to define a first contact hole exposing a portion of the first driving dual gate;
forming a second metal layer over the switching and driving active layers;
patterning the second metal layer to form a switching source, a switching drain, a data line, a driving source and a driving drain, thereby forming a switching thin film transistor and a driving thin film transistor, wherein the driving thin film transistor includes a plurality of sub-TFTs;
forming a second insulating layer over the switching source and drain and the driving source and drain, wherein the second insulating layer includes a second contact hole exposing a portion of the switching drain and a third contact hole exposing a portion of the driving drain;
forming a third metal layer on the second insulating layer;
patterning the third metal layer to form a second driving dual gate and a power line on the second insulating layer, the power line defining the pixel region with intersections of the gate and data lines and electrically communicating with the driving source through the third contact hole, the second driving dual gate having the identical planar shape as that of the first driving dual gate and contacting the switching drain through the second contact hole;
forming a third insulating layer on the second insulating layer to cover the second driving dual gate and the power line, wherein the second and third insulating layers include a fourth contact hole exposing a portion of the driving drain;
forming a connection pattern on the third insulating layer to electrically communicate with the driving drain through the fourth contact hole;
forming a first electrode on a second substrate;
forming an organic electroluminescent layer on the first electrode;
forming a second electrode on the organic electroluminescent layer within the pixel region; and
attaching the second substrate having the second electrode to the first substrate having the connection pattern so as to electrically connect the driving drain to the second electrode.

18. The method according to claim 17, wherein the gate line is disposed in a first direction, the switching gate electrode extends from the gate line in a second direction perpendicular to the gate line, and the first driving dual gate is disposed in the second direction.

19. The method according to claim 17, wherein the switching drain contacts the first driving dual gate through the first contact hole.

20. The method according to claim 17, wherein forming the switching active layer includes forming a switching ohmic contact layer on the switching active layer, wherein the switching source and drain are spaced apart from each other and contact the switching ohmic contact layer.

21. The method according to claim 17, wherein forming the driving active layer includes forming a driving ohmic contact layer on the driving active layer, wherein the driving source and drain are spaced apart from each other and contact the ohmic contact layer.

22. The method according to claim 17, wherein the switching and driving active layers include amorphous silicon.

23. The method according to claim 17, wherein the first driving dual gate includes first and second arms, and the second driving dual gate includes third and second arms overlapping the first and second arms, respectively.

24. The method according to claim 17, wherein the first insulating layer has a first thickness, and the second insulating layer has a second thickness greater than the first thickness.

25. The method according to claim 17, wherein the organic electroluminescent layer includes red, green and blue organic emission layers.

26. The method according to claim 17, wherein the driving drain has a first portion on the driving active layer and a second portion in the pixel region except for the switching and driving regions.

27. The method according to claim 26, wherein the driving source includes a substantially "U" shaped-opening that surrounds the first portion of the driving drain.

28. The method according to claim 17, wherein both of the driving source and drain include a plurality of indentations and protrusions so as to form the plurality of sub-TFTs connected in parallel.

29. The method according to claim 28, wherein the indentations of the driving source correspond to the respective indentions of the driving drain, and the protrusions of the driving source correspond to the respective protrusions of the driving drain.

30. The method according to claim 17, wherein the driving source includes a plurality of indentations and protrusions so as to form a plurality of sub-TFTs connected in parallel, and the indentations and protrusions face the corresponding indentations and protrusions, respectively.

* * * * *